(12) United States Patent
Watanabe et al.

(10) Patent No.: US 7,750,376 B2
(45) Date of Patent: Jul. 6, 2010

(54) SOLID-STATE IMAGING DEVICE AND IMAGING APPARATUS

(75) Inventors: Taketo Watanabe, Asaka (JP); Masanori Nagase, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/802,884

(22) Filed: May 25, 2007

(65) Prior Publication Data
US 2007/0278535 A1    Dec. 6, 2007

(30) Foreign Application Priority Data
May 31, 2006    (JP)    ............. P2006-151684

(51) Int. Cl.
*H01L 27/148*    (2006.01)
(52) U.S. Cl. .................. 257/222; 257/E27.15
(58) Field of Classification Search ........ 257/222, 257/223, 224, 225, 226, 227, 228, 229, 230, 257/231, 232, 233, 234, 235, 246, 237, 238, 257/239, 240, 241, 242, 243, 244, 245, E27.15, 257/E27.151, E27.152
See application file for complete search history.

(56) References Cited

U.S. PATENT DOCUMENTS 5,337,340 A *  8/1994  Hynecek ................ 377/60
2002/0195628 A1 * 12/2002  Yamada ................ 257/290
2006/0170009 A1 *  8/2006  Kitano et al. .......... 257/236

FOREIGN PATENT DOCUMENTS

JP    2609363 B2    2/1997
JP    3483261 B2    10/2003

* cited by examiner

*Primary Examiner*—Sue Purvis
*Assistant Examiner*—Kevin Quinto
(74) *Attorney, Agent, or Firm*—Birch, Stewart, Kolasch & Birch, LLP

(57) ABSTRACT

A CCD type solid-state imaging device includes: a photoelectric conversion element (n layer 2, p layer 3) formed in a semiconductor substrate 1; a charge transfer channel 5 that transfers electric charges generated in the photoelectric conversion element; a charge read region 6 that reads out the electric charges accumulated in the photoelectric conversion element into the charge transfer channel 5; and a charge read electrode 8 formed above the charge read region 6 with a gate insulating film 10 disposed therebetween. The charge read electrode 8 controls the reading out of the electric charges into the charge transfer channel 5. A gap is formed between the photoelectric conversion element and the charge read electrode 8 in plan view.

11 Claims, 4 Drawing Sheets

SOLID-STATE IMAGING DEVICE AND IMAGING APPARATUS

BACKGROUND OF THE INVENTION

1. Technical Field

The invention relates to a CCD type solid-state imaging device.

2. Description of the Related Art

A CCD type solid-state imaging device includes a plurality of photoelectric conversion elements, a plurality of vertical transfer sections (VCCD) that read out electric charges generated in each of the plurality of photoelectric conversion elements and that transfer the read charges in the vertical direction, a horizontal transfer section (HCCD) that transfers the electric charges transferred from each of the plurality of VCCD in the horizontal direction perpendicular to the vertical direction, and an output section that outputs an imaging signal corresponding to the electric charges transferred from the HCCD.

The VCCD includes a charge transfer channel formed in a silicon substrate and a plurality of electrodes formed above the charge transfer channel with a gate insulating film disposed therebetween. There is known a technique for improving the sensitivity by multiplying electric charges by means of avalanche multiplication when transferring electric charges through a charge transfer channel (for example, see Japanese Patent No. 2609363 and Japanese Patent No. 3483261).

In a method of multiplying electric charges during charge transfer as described above, noise charges and smear charges existing in the charge transfer channel are also multiplied. Accordingly, S/N (signal-to-noise ratio) is decreased.

SUMMARY OF THE INVENTION

The invention has been made in view of the above circumstances and provides a solid-state imaging device that can multiply only electric charges generated and accumulated in photoelectric conversion elements.

According to an aspect of the invention, a CCD type solid-state imaging device includes a photoelectric conversion element, a charge transfer channel, a charge read region and a charge read electrode. The photoelectric conversion element is formed in a semiconductor substrate. The charge transfer channel transfers electric charges generated in the photoelectric conversion element. The charge read region reads out the electric charges into the charge transfer channel. The charge read electrode is formed above the charge read region with a gate insulating film disposed therebetween. The charge read electrode controls the reading out of the electric charges into the charge transfer channel. A gap is formed between the photoelectric conversion element and the charge read electrode in plan view.

Also, the following expression may be satisfied:

$$0 \text{ μm} < L < 0.34 \text{ μm}$$

where L denotes a width of a portion, in which the charge read region and the charge read electrode overlap each other in plan view, in a direction from the photoelectric conversion element to the charge transfer channel. The following expression may be further satisfied:

$$0 \text{ μm} < L < 0.3 \text{ μm}.$$

The solid-state imaging device may further include a light shielding layer and a terminal. The light shielding layer is formed above the semiconductor substrate. The light shielding layer has an opening formed above the photoelectric conversion element. The terminal is used to apply, to the light shielding layer, a voltage having a polarity opposite to a read voltage applied to the charge read electrode to read out the electric charges.

An imaging apparatus includes any of the solid-state imaging device and a driving section. The driving section drives the solid-state imaging device. The driving section applies the voltage having the polarity opposite to the read voltage to the light shielding layer during a predetermined time period for which the read voltage is applied to the charge read electrode.

According to the above configuration, it is possible to provide a solid-state imaging device that can multiply only electric charges generated and accumulated in photoelectric conversion elements.

DETAILED DESCRIPTION OF EXEMPLARY EMBODIMENTS OF THE INVENTION

Hereinafter, embodiments of the invention will be described with reference to the accompanying drawings.

Figure 1A:
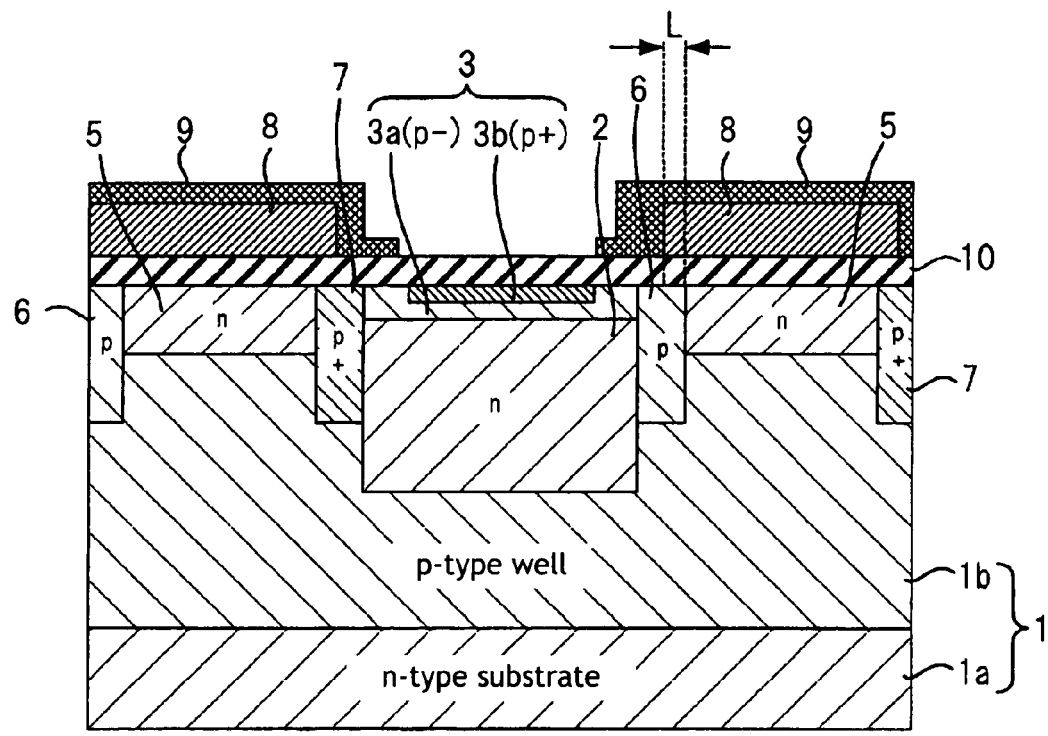
FIG. 1 is a view schematically illustrating the configuration of a solid-state imaging device according to an embodiment of the invention.
Figure 1B:
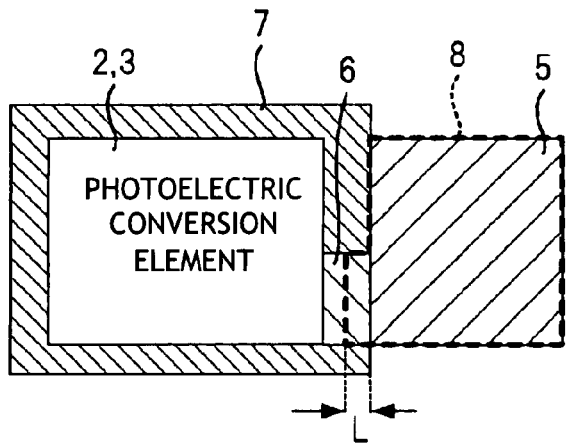

FIG. 1A is a section view schematically illustrating a solid-state imaging device according to an embodiment of the invention. FIG. 1B is a plan view schematically illustrating the solid-state imaging device shown in FIG. 1A in a state where members on or above a semiconductor substrate are removed.

A semiconductor substrate 1 includes an n-type (first conductivity type) semiconductor substrate 1a and a p-type (second conductivity type) p well layer 1b formed on the n-type semiconductor substrate 1a. A p-type impurity layer (hereinafter, referred to as 'P layer') 3 is formed in a surface portion of the p well layer 1b. An n-type impurity layer (hereinafter, referred to as 'n layer') 2 is formed below the P layer 3. Electric charges (electrons), which are generated inside the n layer 2 and which are at a pn junction between the n layer 2 and the p well layer 1b by photoelectric conversion, are accumulated in the n layer 2. Moreover, electric charges generated in the p layer 3 are also accumulated in the n layer 2. The p layer 3, the n layer 2, and the p well layer 1b form a photoelectric conversion element. The p layer 3 is provided to prevent noises from occurring in a range from a depletion layer located at an upper portion of the n layer 2 to a surface of the semiconductor substrate 1.

In addition, a charge transfer channel 5 made of an n layer is formed on a right side of the p layer 3 and the n layer 2 so as to be spaced apart therefrom. A charge read region 6 is formed in the p well layer 1b and between the p layer 3/then layer 2 and the charge transfer channel 5. The charge read region 6 reads out electric charges, which are generated in the photoelectric conversion element and which are accumulated in the n layer 2, into the charge transfer channel 5. An electrode 8 made of, for example, polysilicon is formed above the charge transfer channel 5 and the charge read region 6 through a gate insulating film 10 made of a silicon oxide film or an ONO film. The electrode 8 serves as both a charge transfer electrode that supplies a voltage to the charge transfer channel 5 to control the charge transfer operation and a charge read electrode that supplies a read voltage to the charge read region 6 to control the charge read operation. A light shielding layer 9 made of, for example, tungsten or aluminum is formed on the electrode 8. In the light shielding layer 9, an opening is formed above the photoelectric conversion element.

In the periphery of the photoelectric conversion element, the adjacent charge transfer channel 5 through which electric charges accumulated in the photoelectric conversion element are not read out and an element separation layer 7 made of high-concentration p-type impurities for separation the photoelectric conversion element from other elements, such as photoelectric conversion elements, adjacent to the photoelectric conversion element are formed in portions other than the charge read region 6 formed between the photoelectric conversion element and the charge transfer channel 5 through which the electric charges accumulated in the photoelectric conversion element are read out.

The p layer 3 has a two-layered structure including a low-concentration impurity layer 3a and a high-concentration impurity layer 3b. In the low-concentration impurity layer 3a, impurity concentration of p-type impurities is relatively low. The high-concentration impurity layer 3b is formed in a surface portion of the low-concentration impurity layer 3a. Impurity concentration of the high-concentration impurity layer 3b is higher than that of the low-concentration impurity layer 3a. Here, the surface portion of the low-concentration impurity layer 3a indicates a portion including a surface of the low-concentration impurity layer 3a and the inside of the low-concentration impurity layer 3a near its surface. The impurity concentration of the low-concentration impurity layer 3a is lower than that of the element separation layer 7 and than that of the charge read region 6. Accordingly, it is possible to prevent smear.

Referring to FIG. 1B, in the solid-state imaging device according to this embodiment, a gap is formed between the photoelectric conversion element and the electrode 8 in plan view. Also, the expression $0 \mu m < L < 0.34 \mu m$ is satisfied where 'L' denotes a width of a portion, in which the charge read region 6 and the electrode 8 overlap each other, in a direction from the photoelectric conversion element to the charge transfer channel 5. In addition, since electric charges cannot be read out if 'L' is equal to 0, the lower limit of 'L' is set to be larger than 0. The inventors found that with this configuration, impact ionization occurred when the electric charges accumulated in the n layer 2 were read out into the charge transfer channel 5 through the charge read region 6.

Figure 2:
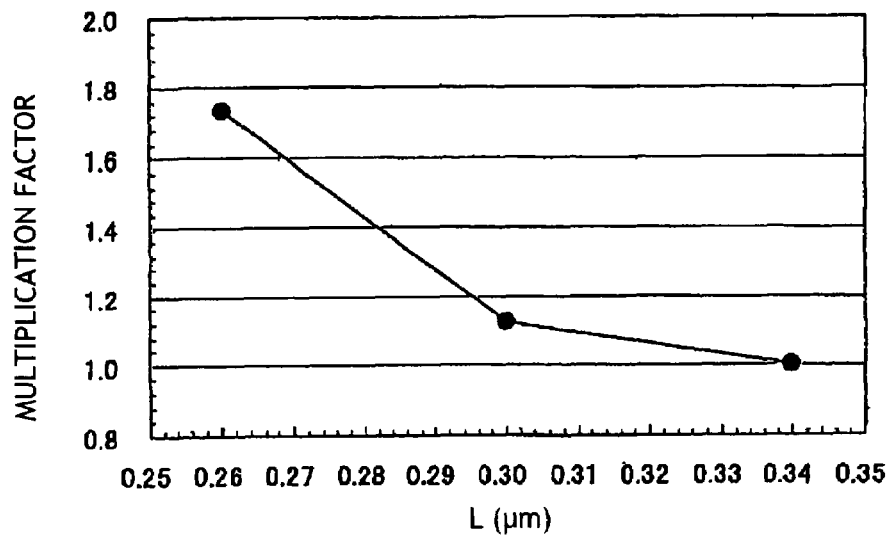
FIG. 2 is a view illustrating a result of an experiment for measuring a multiplication factor of electric charges in each value of 'L' while changing 'L.'
Figure 3:
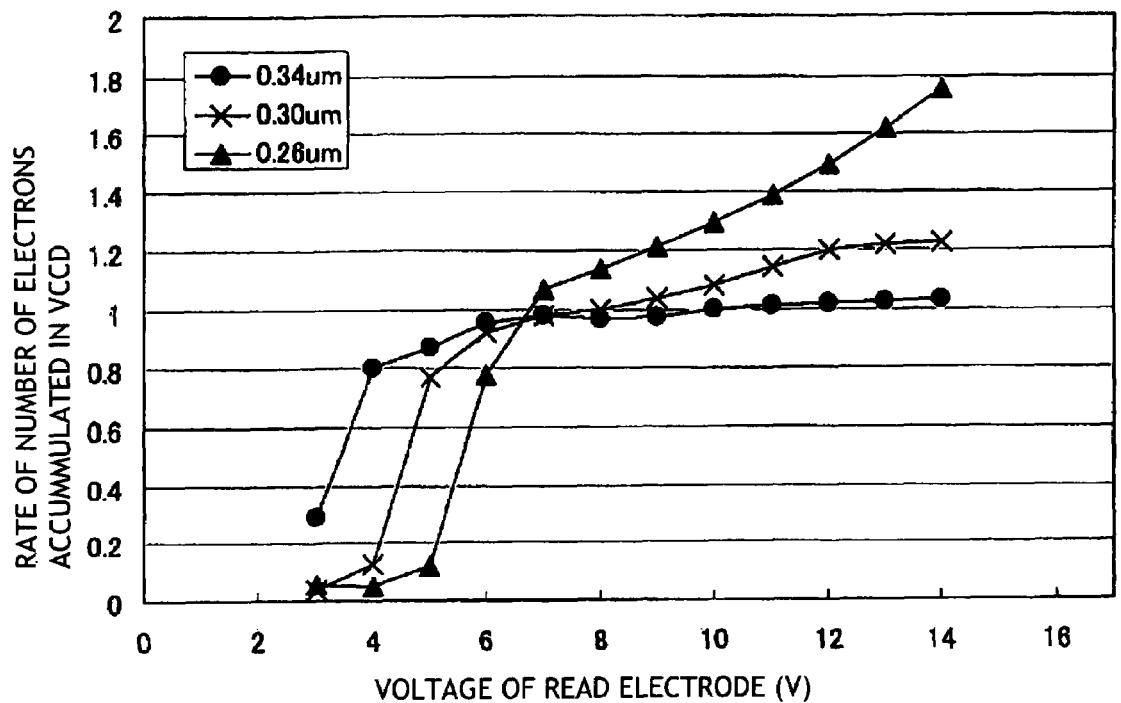
FIG. 3 is a view illustrating a result of an experiment for measuring a rate of the number of electrons, which are collected in a charge transfer channel, in each read voltage while changing the read voltage.

FIG. 2 is a view illustrating a result of an experiment for measuring a multiplication factor of electric charges in each 'L' while changing 'L'. FIG. 3 is a view illustrating a result of an experiment for measuring a rate (value obtained by dividing the number of electrons collected in the charge transfer channel 5 by the number of electrons accumulated in the n layer 2 before reading out the electrons) of the number of electrons, which are collected in the charge transfer channel 5, in each read voltage applied to the electrode 8 while changing the read voltage. In addition, in this experiment, the width of the charge read region 6 in the direction from the photoelectric conversion element to the charge transfer channel 5 was set to 0.34 μm.

As shown in FIG. 2, when 'L' is 0.34 μm, the multiplication factor is equal to about 1.0. That is, it can be seen that impact ionization does not occur. On the other hand, if 'L' is smaller than 0.34 μm, the multiplication factor becomes larger than 1.0. That is, electric charges are multiplied by impact ionization. Particularly if 'L' is equal to or smaller than 0.3 μm, increase of the multiplication factor is noticeable. Moreover, as shown in FIG. 3, in the case where 'L' is equal to 0.34 μm, the number of electric charges collected in the charge transfer channel 5 is saturated at a predetermined voltage as the read voltage increases. On the other hand, in the case where 'L' is smaller than 0.34 μm, the number of electric charges also increases as the read voltage increases. Thus, it can be seen that if 'L' is not smaller than 0.34 μm, the electric charges are not multiplied even if the read voltage is increased. From the result described above, it can be seen that the impact ionization occurs under the condition of $0 \mu m < L < 0.34 \mu m$, such that the electric charges are multiplied.

According to the solid-state imaging device having the configuration described above, it is possible to multiply only the electric charges that are generated inside the photoelectric conversion element and that are accumulated in the n layer 2. As a result, it becomes possible to improve S/N as compared with a known technique in which noise charges, smear charges, and the like existing in the charge transfer channel 5 are also multiplied. Moreover, since it is not necessary to devise a method of driving a solid-state imaging device, it is possible to easily realize the high sensitivity as compared with the known technique.

In addition, the solid-state imaging device shown in FIG. 1 has a region, in which the electrode 8 does not exist, on the charge read region 6, and the light shielding layer 9 is formed even in this region. It is also possible to further increase a charge multiplication factor using this configuration. For example, a terminal used to apply a voltage, which has a polarity opposite to a read voltage applied to the electrode 8 may be provided in the solid-state imaging device shown in FIG. 1. When the voltage having the polarity opposite to the read voltage is applied to the light shielding layer 9 during a period for which the read voltage is being applied, a charge multiplication effect due to impact ionization can be further increased.

Specifically, it is assumed that an imaging apparatus such as a digital still camera includes the solid-state imaging device having the terminal and a driving section that drives the solid-state imaging device. In this case, the driving section may perform driving to apply the voltage having the polarity opposite to the read voltage to the light shielding layer 9 during the period for which the read voltage is being applied to the electrode 8, so as to read out electric charges from the n layer 2 into the charge transfer channel 5.

Figure 4:
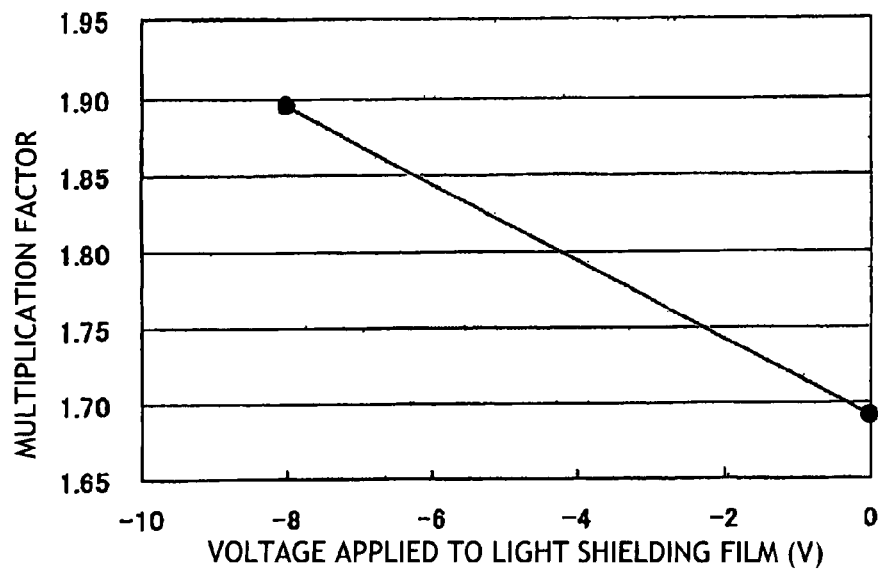
FIG. 4 is a view illustrating a result of simulation for calculating change in a multiplication factor when a negative voltage is applied to a light shielding layer while a read voltage is applied.

FIG. 4 is a view illustrating a result of a simulation for calculating change in a multiplication factor when applying a negative voltage to the light shielding layer 9 while a positive read voltage is applied to the electrode 8. In this simulation, L=0.26 μm.

As shown in FIG. 2, the multiplication factor at L=0.26 μm is about 1.68. As shown in FIG. 4, a multiplication factor when a voltage applied to the light shielding layer 9 is equal to 0 V is about 1.68, which is not changed. On the other hand, a multiplication factor when a voltage applied to the light shielding layer 9 is equal to −8 V is about 1.90. That is, it can be seen that the multiplication factor is increased by applying the voltage having the polarity opposite to the read voltage to the light shielding layer 9 during the time period for which the read voltage is being applied.

In the case of applying a voltage to the light shielding layer 9, a potential difference between a potential of the charge read region 6 located below the light shielding layer 9 and a potential of the charge read region 6 located below the electrode 8 is large. As a result, the impact ionization occurs strongly, and thus it is considered that the multiplication factor increases.

Figure 5:
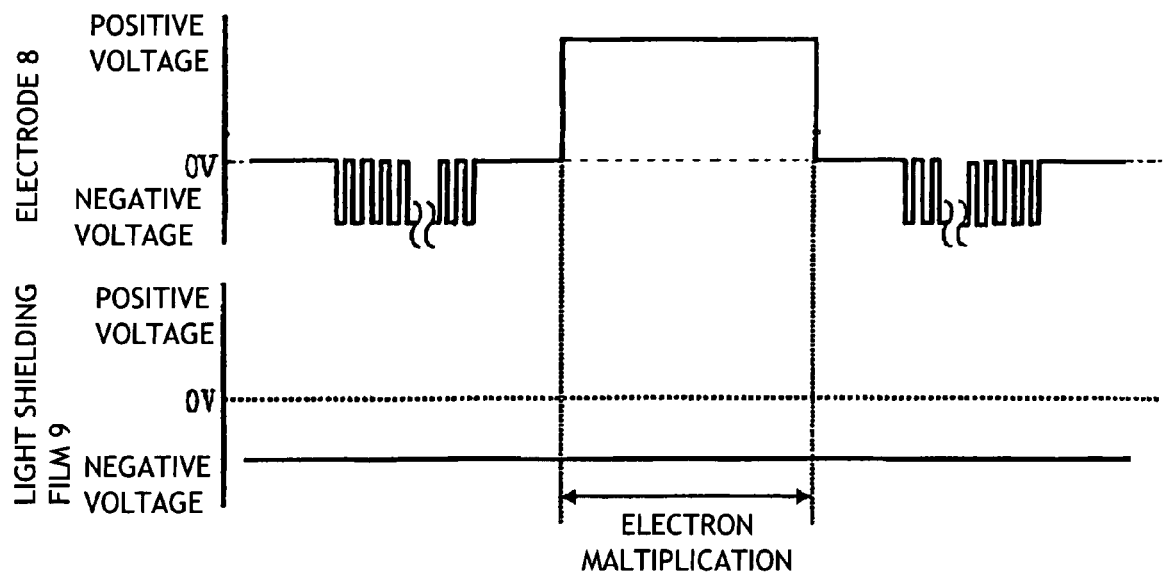
FIG. 5 is a view illustrating an example of a driving timing by a driving section.
Figure 6:
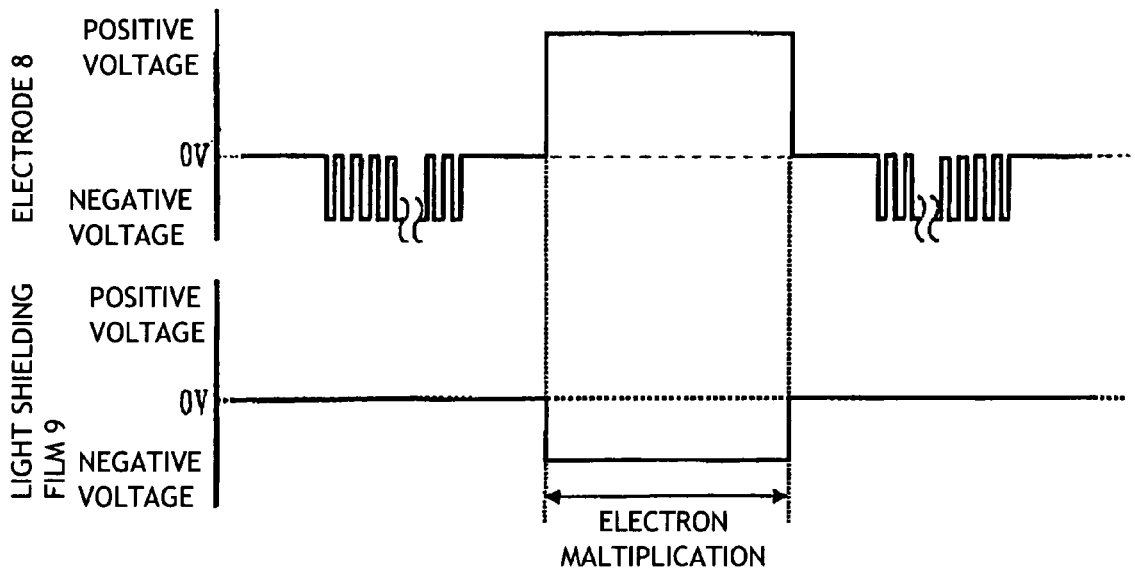
FIG. 6 is a view illustrating an example of a driving timing by the driving section.
Figure 7:
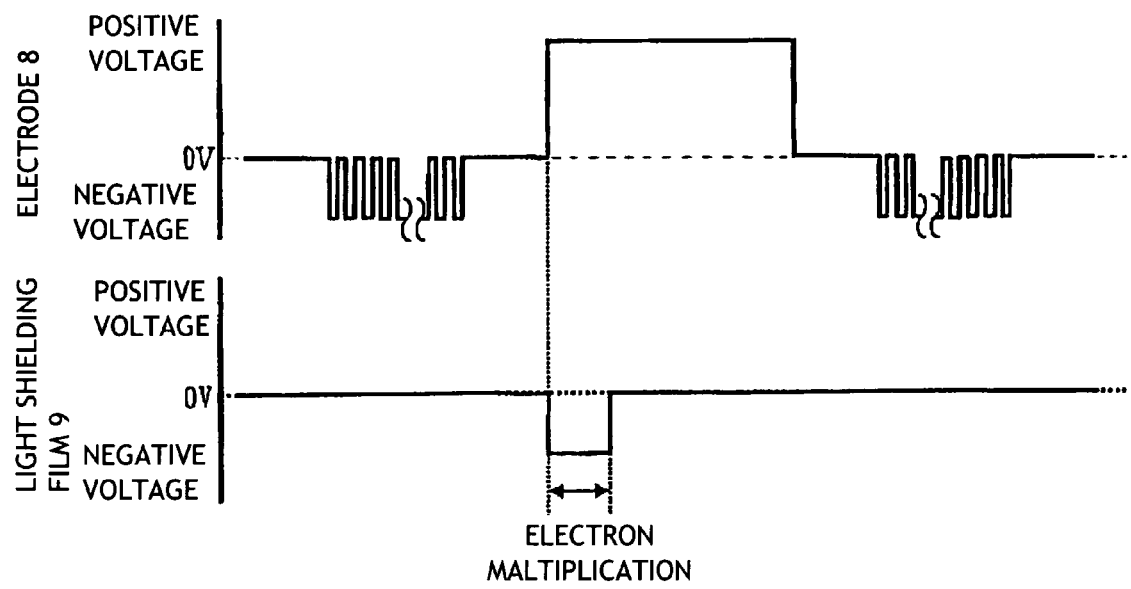
FIG. 7 is a view illustrating an example of a driving timing by the driving section.

FIGS. 5 to 7 are views illustrating examples of a driving timing by the driving section.

As shown in FIG. 5, the driving section may perform driving for reading out electric charges into the charge transfer channel 5 by continuously applying a negative voltage to the light shielding layer 9 during an imaging time period and then applying a positive read voltage to the electrode 8 after completion of an exposure period. Due to the driving described above, it becomes possible to make large the potential difference between the potential of the charge read region 6 located below the light shielding layer 9 and the potential of the charge read region 6 located below the electrode 8. As a result, it is possible to increase the charge multiplication factor as compared with the case where the negative voltage is not applied to the light shielding layer 9.

In addition, as shown in FIG. 6, the driving section may perform driving for applying a negative voltage to the light shielding layer 9 only during a period for which a positive read voltage is being applied to the electrode 8 after the completion of the exposure period. Alternatively, as shown in FIG. 7, the driving section may perform driving for applying a negative voltage to the light shielding layer 9 during only a part (period for which electric charges actually move from the n layer 2 to the charge transfer channel 5; for example, a time period of 1 μs after the start of application of the read voltage) of the period for which the positive read voltage is being applied after the completion of the exposure period. In addition, in the driving shown in FIGS. 6 or 7, the timing at which the voltage is applied to the light shielding layer 9 may be set simultaneously with the application of the read voltage to the electrode 8 or immediately before the application of the read voltage to the electrode 8 (before several nanoseconds to microseconds).

By shortening the time period for which the voltage is applied to the light shielding layer 9 as shown in FIGS. 6 and 7, a stress applied to the gate insulating film 10 located between the light shielding layer 9 and the semiconductor substrate 1 is reduced. Accordingly, it is not necessary to make the gate insulating film 10 thick. As a result, it is possible to prevent smear from increasing due to diffraction of light. In addition, it is possible to reduce power consumption.

What is claimed is:

1. A CCD type solid-state imaging device comprising:
    a photoelectric conversion element formed in a semiconductor substrate;
    a charge transfer channel that transfers electric charges generated in the photoelectric conversion element;
    a charge read region that reads out the electric charges into the charge transfer channel;
    a charge read electrode formed above the charge read region with a gate insulating film disposed therebetween, the charge read electrode that controls the reading out of the electric charges into the charge transfer channel; and
    a light shielding layer, wherein:
    a gap is formed between the photoelectric conversion element and the charge read electrode in plan view,
    the gate insulating film is provided between the light shielding layer and the charge read region so that the gate insulating film is in direct contact with the light shielding layer and the charge read region, and
    the light shielding layer is formed on the charge read region in a portion which is unoccupied by the charge read electrode along the gate insulating film.

2. The solid-state imaging device according to claim 1, further comprising:
    an element separation layer for separating the photoelectric conversion element from other elements, said element separation layer surrounding the photoelectric conversion element in all portions other than the charge read region.

3. The solid-state imaging device according to claim 1, wherein a potential difference between a potential of the charge read region located below the light shielding layer and a potential of the charge read region located below the charge read electrode is made large, to increase a multiplication factor of electric charges by impact ionization.

4. The solid-state imaging device according to claim 1, wherein the following expression is satisfied $$0\ \mu m < L < 0.34\ \mu m$$

where L denotes a width of a portion, in which the charge read region and the charge read electrode overlap each other in plan view, in a direction from the photoelectric conversion element to the charge transfer channel.

5. The solid-state imaging device according to claim 4, wherein the following expression is further satisfied:

$$0\ \mu m < L < 0.3\ \mu m$$

6. The solid-state imaging device according to claim 4, wherein
    the light shielding layer is formed above the semiconductor substrate, the light shielding layer having an opening formed above the photoelectric conversion element; and
    further comprising:
    a terminal that is used to apply, to the light shielding layer, a voltage having a polarity opposite to a read voltage applied to the charge read electrode to read out the electric charges.

7. The solid-state imaging device according to claim 5, wherein
    the light shielding layer is formed above the semiconductor substrate, the light shielding layer having an opening formed above the photoelectric conversion element; and
    further comprising:
    a terminal that is used to apply, to the light shielding layer, a voltage having a polarity opposite to a read voltage applied to the charge read electrode to read out the electric charges.

8. An imaging apparatus comprising:
    the solid-state imaging device according to claim 6; and
    a driving section that drives the solid-state imaging device, wherein:
    the driving section applies the voltage having the polarity opposite to the read voltage to the light shielding layer during a predetermined time period for which the read voltage is applied to the charge read electrode.

9. An imaging apparatus comprising:
    the solid-state imaging device according to claim 7; and
    a driving section that drives the solid-state imaging device, wherein:
    the driving section applies the voltage having the polarity opposite to the read voltage to the light shielding layer during a predetermined time period for which the read voltage is applied to the charge read electrode.

10. The solid-state imaging device according to claim 1, wherein the light shielding layer is formed above the semiconductor substrate, the light shielding layer having an opening formed above the photoelectric conversion element; and further comprising:

a terminal that is used to apply, to the light shielding layer, a voltage having a polarity opposite to a read voltage applied to the charge read electrode to read out the electric charges.

11. An imaging apparatus comprising:

the solid-state imaging device according to claim 10; and a driving section that drives the solid-state imaging device, wherein:

the driving section applies the voltage having the polarity opposite to the read voltage to the light shielding layer during a predetermined time period for which the read voltage is applied to the charge read electrode.

* * * * *